(12) United States Patent
Guo

(10) Patent No.: US 7,630,232 B2
(45) Date of Patent: *Dec. 8, 2009

(54) SYNTHETIC ANTI-FERROMAGNETIC STRUCTURE WITH NON-MAGNETIC SPACER FOR MRAM APPLICATIONS

(75) Inventor: Yimin Guo, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 101 days.

This patent is subject to a terminal disclaimer.

(21) Appl. No.: 11/901,080

(22) Filed: Sep. 14, 2007

(65) Prior Publication Data

US 2008/0007994 A1     Jan. 10, 2008

Related U.S. Application Data

(63) Continuation of application No. 11/350,119, filed on Feb. 8, 2006, now Pat. No. 7,280,389.

(51) Int. Cl.
    *G11C 11/00*    (2006.01)
(52) U.S. Cl. .................... 365/158; 365/171; 365/173
(58) Field of Classification Search ............... 365/158, 365/171, 173, 55; 257/295, E21.665, E21.005
See application file for complete search history.

(56) References Cited

U.S. PATENT DOCUMENTS

| 6,292,389 | B1 * | 9/2001 | Chen et al. ............... 365/158 |
| 6,531,723 | B1 | 3/2003 | Engel et al. |
| 6,545,906 | B1 | 4/2003 | Savtchenko et al. |
| 6,714,446 | B1 | 3/2004 | Engel |
| 6,956,764 | B2 | 10/2005 | Engel et al. |
| 6,967,366 | B2 | 11/2005 | Janesky et al. |
| 7,256,971 | B2 | 8/2007 | Horng et al. |
| 7,280,389 | B2 * | 10/2007 | Guo ............... 365/158 |
| 2005/0153063 | A1 | 7/2005 | Janesky et al. |
| 2007/0177420 | A1 | 8/2007 | Guo |

OTHER PUBLICATIONS

"A Low Power 1 Mbit MRAM Based on 1T1MTJ Bit Cell Integrated with Copper Interconnects", by M. Durlam et al., VLSI Conf. (2002), pp. 1-22, Motorola.

(Continued)

*Primary Examiner*—David Lam
(74) *Attorney, Agent, or Firm*—Saile Ackerman LLC; Stephen B. Ackerman

(57) ABSTRACT

A toggle MTJ cell is disclosed that has a nearly balanced SAF free layer with two major sub-layers separated by an anti-parallel coupling layer. Within each major sub-layer, there is a plurality of minor sub-layers wherein adjacent minor sub-layers are separated by a parallel coupling layer. The parallel coupling layer is a non-magnetic layer that may be a one or more of Ta, Cu, Cr, Ru, Os, Re, Rh, Nb, Mo, W, Ir, and V, a metal oxide, or dusting of NiCr, Ta, Cu, or NiFeCr. Magnetic moments of major sub-layers are made to be nearly equal so that the net moment of the SAF free layer is essentially zero. The MTJ cell and SAF free layer preferably have an aspect ratio of from 1 to 5. Ferromagnetic coupling between minor sub-layers enables a lower write current and lower power consumption than conventional toggle cell designs.

9 Claims, 6 Drawing Sheets

OTHER PUBLICATIONS

A 0.18 μm, 4Mb Toggling MRAM, by M. Durlam et al, IEDM Technical Digest 2003, Session 34, paper # 6, Freescale Semiconductor, Inc.

"Enhancement of writing margin for low switching toggle MRAM's using multilayer synthetic anti ferromagnetic structures", by Y. Fukumoto et al., Paper FB-07, 50$^{th}$ MMM Meeting, San Jose, CA (2005), found http://www.abstractcentral.com/planner, Aug. 9, 2005.

* cited by examiner

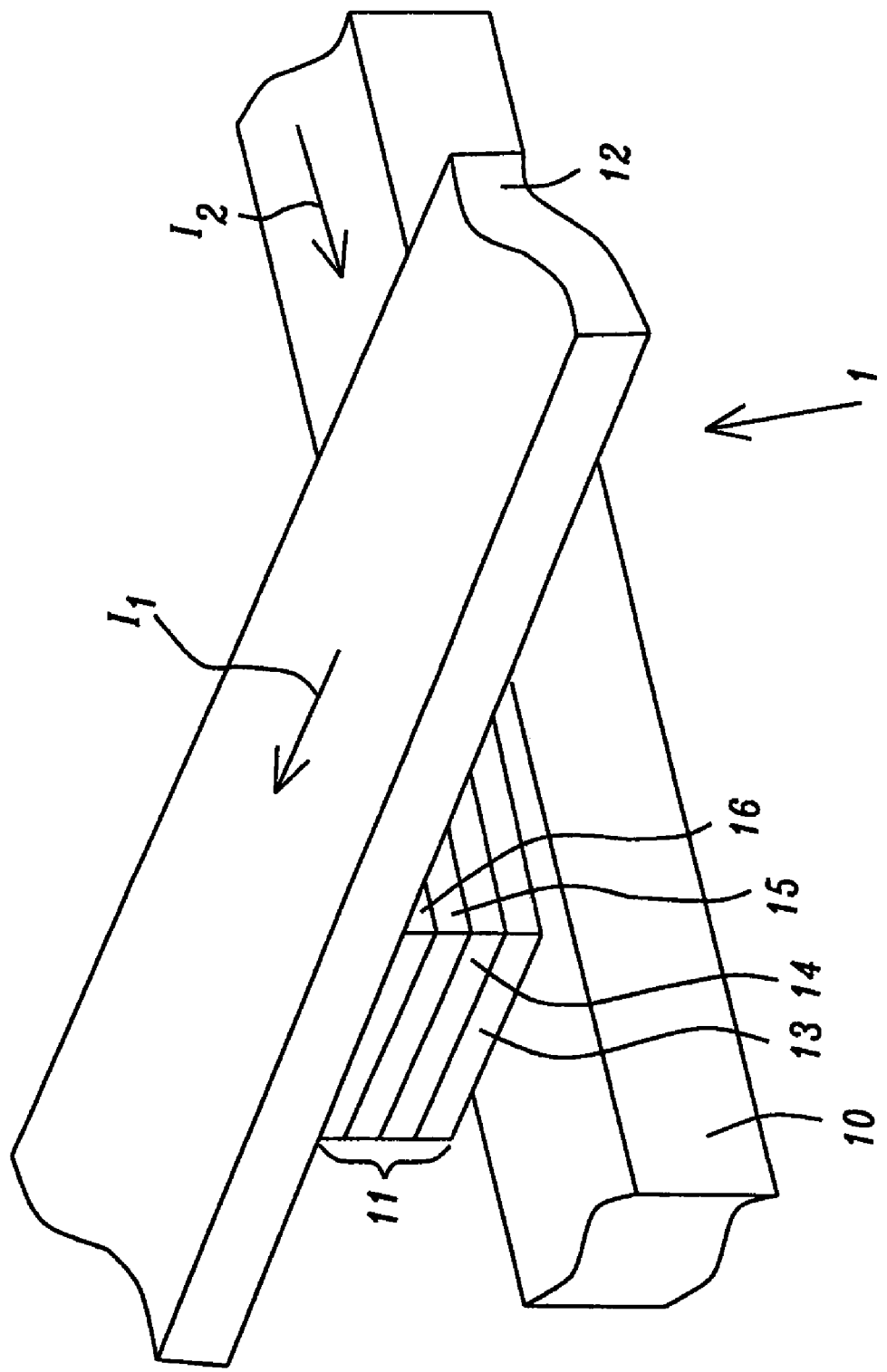
FIG. 1 – Prior Art

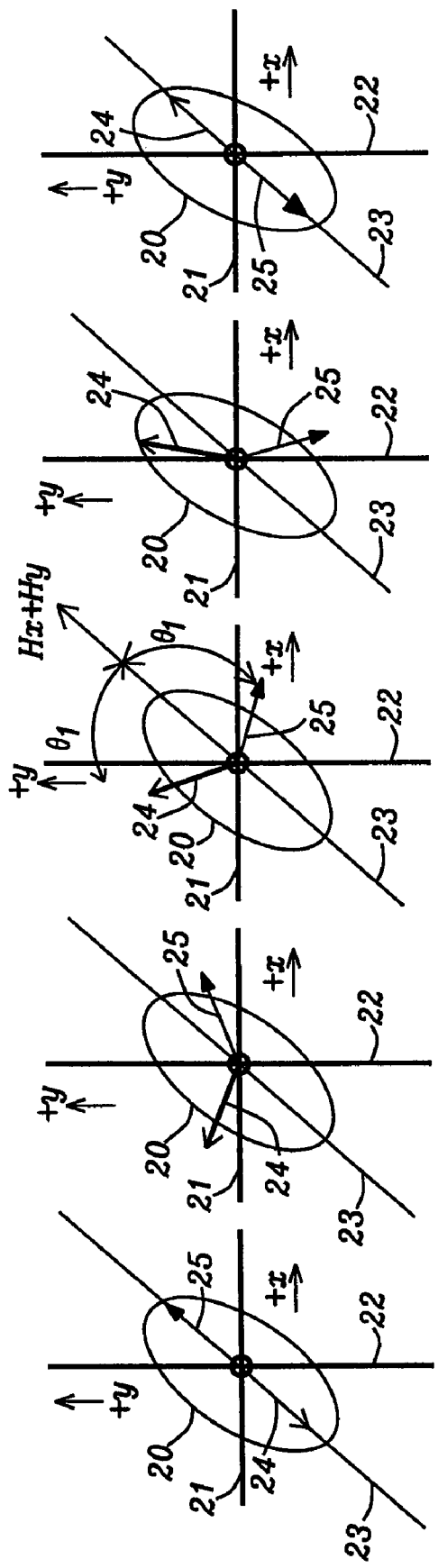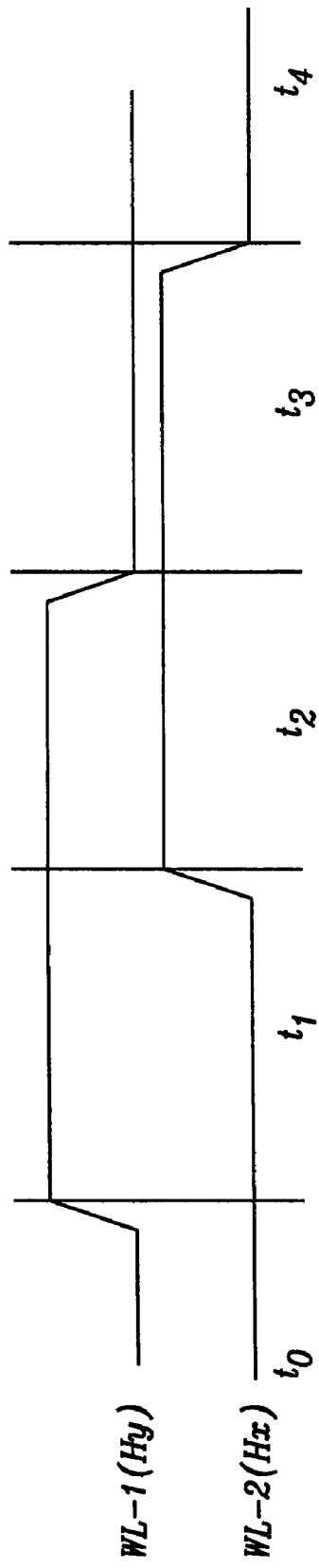
FIG. 2 – Prior Art

SYNTHETIC ANTI-FERROMAGNETIC STRUCTURE WITH NON-MAGNETIC SPACER FOR MRAM APPLICATIONS

This is a continuation of U.S. patent application Ser. No. 11/350,119, filed on Feb. 8, 2006, now U.S. Pat. No. 7,280,389, which is herein incorporated by reference in its entirety, and assigned to a common assignee.

RELATED PATENT APPLICATIONS

This application is related to the following: Ser. No. 11/340,989, filing date Jan. 27, 2006, assigned to a common assignee; Ser. No. 10/796,387, filing date Mar. 9, 2004, now issued as U.S. Pat. No. 7,256,971.

FIELD OF THE INVENTION

The invention relates to an MRAM structure having a magnetic region comprised of a synthetic anti-ferromagnetic (SAF) free layer with a multilayer structure in which two major sub-layers are strongly anti-parallel coupled through an anti-ferromagnetic coupling layer and minor sub-layers within each of the two major sub-layers are ferromagnetically coupled to lower the write current.

BACKGROUND OF THE INVENTION

Magnetic random access memory (MRAM) that incorporates a magnetic tunneling junction (MTJ) as a memory storage cell is a strong candidate to provide a high density, fast (1-30 ns read/write speed), and non-volatile storage solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and an MTJ formed at each location where a second conductive line crosses over a first conductive line. A first conductive line may be a word line while a second conductive line is a bit line or vice versa.

Referring to FIG. 1, a conventional MRAM structure 1 is shown in which an MTJ 11 is formed between a first conductive line 10 and a second conductive line 12. In this example, the first conductive line is a word line and the second conductive line is a bit line although the terms are interchangeable. A conductive line may also be referred to as a digit line, row line, data line or column line. The word line 10 and bit line 12 are used for writing data into the MTJ 11. The MTJ consists of a stack of layers with a configuration in which two ferromagnetic layers are separated by a thin non-magnetic insulating layer such as $Al_2O_3$, $AlN_x$, or $MgO$ which is called a tunnel barrier layer. In a so-called bottom spin valve configuration, the bottom portion 13 is a composite layer with a lower seed layer, a middle anti-ferromagnetic (AFM) layer, and an upper pinned layer (first ferromagnetic layer). The AFM layer is exchange coupled to the pinned layer and thereby fixes the magnetization (magnetic moment) direction of the pinned layer in a preset direction. Above the pinned layer is the tunnel barrier layer 14. The second ferromagnetic layer is a free layer 15 on the tunnel barrier layer and has a magnetization direction that can be changed by external magnetic fields. To maintain data against erasure or thermal agitation, an in-plane uni-axial magnetic anisotropy is needed for the free layer 15. The top layer in the MTJ 11 is generally a cap layer 16.

During a write operation, an electrical current $I_1$ in bit line 12 and a current $I_2$ in word line 10 yield two magnetic fields on the free layer 15. The magnetic fields conform to a right hand rule so that a first field is generated along a first axis (easy axis) in the plane of the free layer and a second field is produced in a direction orthogonal to the first axis and along a hard axis in the free layer. In response to the magnetic fields generated by currents $I_1$ and $I_2$, the magnetic vector in the free layer is oriented in a particular stable direction that represents a memory state. The resulting magnetic vector orientation depends on the direction and magnitude of $I_1$ and $I_2$ and the properties and shape of the free layer 15. Generally, writing a zero "0" requires the direction of either $I_1$ or $I_2$ to be different than when writing a one "1". Thus, the magnetization direction of the free layer may be switched from a "+x" to a "−x" direction, for example, that corresponds to a change in the memory state from a "0" to a "1" or vice versa.

The magnitude of the magnetic field used to switch the magnetic vector is proportional to the magnitude of $I_1$ and $I_2$ which is on the order of several milli-Amperes for most designs. As the size of MTJs shrinks to 0.1 micron or smaller, the switching fields are expected to become larger and switch transistors will demand a larger amount of chip area. It is desirable to reduce power consumption and this adjustment is achieved in some cases by increasing the field per current ratio of the conductor. A prior art method for increasing the field per current ratio is to provide a magnetic liner or cladding layer on one or more sides of a conductive line. Examples of cladding layers are described by Naji et al. in "A low power 1 Mbit MRAM based on ITIMTJ bit cell integrated with Copper Interconnects", VLSI Conf. (2002).

The typical writing scheme is a "half select" scheme where a bit line and word line each generates half the required write field for switching the selected MTJ cell. However, the energized word and bit lines reduce the magnetic reversal energy barrier in the other cells along their respective word and bit lines. This condition makes these "half-selected" cells more susceptible to having their magnetic states unintentionally switched when the selected cell is written.

An MRAM with a MTJ cell structure and switching mechanism that does not suffer from the half select problem of the conventional MRAM has been proposed by Motorola. This "Savtchenko" cell structure and switching mechanism are described in U.S. Pat. No. 6,545,906 and by M. Durlam et al. in "A 0.18 micron 4 Mb Toggling MRAM", IEDM Technical Digest 2003, Session 34, paper #6. In this type of MRAM, the MTJ cell's ferromagnetic free layer is a synthetic anti-ferromagnet (SAF) that may be a multilayer of two ferromagnetic sub-layers of nearly identical magnetic moment, separated by an anti-ferromagnetic coupling layer that maintains an anti-parallel alignment of the moments of the two sublayers. In a SAF free layer, the sublayer which directly contacts the MTJ tunnel barrier layer is the sensing layer. The pinned layer on the opposite side of the barrier layer is the reference layer. When the sensing layer and pinned layer magnetization directions are parallel, the MTJ cell has low resistance, and when the magnetization directions are anti-parallel, the cell has a high resistance.

The Savtchenko type of MRAM uses two orthogonal writing or programming lines, but with the MTJ cell's axis aligned 45 degrees to each of the lines. The SAF free layer responds to the applied magnetic fields differently than a conventional single ferromagnetic free layer. Writing occurs by a process called "toggle" writing in which a two phase programming pulse sequence incrementally rotates the SAF free layer moment or magnetization direction 180 degrees so the MRAM is sometimes called a "toggling" MRAM and the memory cell a "toggle" cell. Because of the cell's 45 degree angle to the programming lines and its field response, the field from a single programming line cannot switch the magnetization of a half selected cell and thereby results in an MRAM with enhanced cell selectivity.

In U.S. Patent Publication No. 2005/0153063, the SAF free layer has weakly coupled regions formed in the anti-ferromagnetic coupling layer by a treatment such as annealing, layering of the anti-ferromagnetic coupling layer, or forming the anti-ferromagnetic coupling layer over a roughened surface of a ferromagnetic layer. Without significant reduction of the saturation field, the weakly coupled regions lower the spin flop field of the SAF free layer in comparison to an untreated SAF free layer. The SAF flop is used during the write operation of a toggle MTJ cell design and its reduction results in lower power consumption during write operations and correspondingly increased device performance.

An alternative method to reduce the write field is to use a multilayer synthetic anti-ferromagnet as described by Y. Fukumoto et al in "Enhancement of writing margin for low switching toggle MRAMs using multilayer synthetic anti-ferromagnetic structures", Paper FB-07, $50^{th}$ MMM Meeting, San Jose, Calif. (2005). In this approach, multiple magnetic layers are coupled in an anti-parallel configuration and a weak anti-ferromagnetic coupling field is used to lower spin flop writing field while maintaining a high saturation field. However, weak anti-ferromagnetic coupling as applied here in either local regions or the full film is very difficult to control during MTJ film depositions and thereby causes a manufacturability issue.

The conventional toggling writing process always changes the selected cell, independent of the sensing layer magnetization direction since the two magnetic sub-layers in the SAF are symmetrical. The toggling MRAM is a "read before write" MRAM which means all the toggle memory cells have to be read first to find their magnetic states and determine whether toggling writing is needed. This "read before write" scheme significantly reduces the write cycle time.

It is desirable to further improve the performance of the toggle MTJ cell by reducing the write current and thereby increasing the field per current ratio. A smaller and more uniform spin-flop field is needed to lower the power consumption of a toggle cell and make toggle MRAM more competitive with DRAM, SRAM, and FLASH memory chips. Moreover, a process that can be reproduced easily in manufacturing is needed to improve control of the toggle MRAM structure.

SUMMARY OF THE INVENTION

One objective of the present invention is to provide a toggling MRAM structure in which a nearly balanced SAF free layer can be achieved through a strong anti-parallel coupling of two major sub-layers wherein each of the two major sub-layers has at least two minor sub-layers that are ferromagnetically coupled.

A further objective of the present invention is to provide a toggle MTJ according to the first objective that has a lower write current requirement than conventional toggle cell designs.

Yet another objective of the present invention is to provide a method of forming the toggle MTJ cell according to the first two objectives.

These objectives are achieved in an MRAM structure comprised of an MTJ that is sandwiched between a first conductive line and second conductive line which are hereafter referred to as bit line and word line, respectively. In one aspect, there is a bit line having a top surface that contacts the bottom of the MTJ and a word line aligned orthogonally to the bit line that has a bottom surface in contact with the top surface of the MTJ. The MTJ may have a bottom spin valve configuration wherein a seed layer, AFM layer, pinned layer, tunnel barrier, free layer, and cap layer are sequentially formed on the bit line. Preferably, the free layer has a synthetic anti-ferromagnetic (SAF) configuration wherein a first major sub-layer on the tunnel barrier layer is strongly anti-parallel coupled to an overlying second major sub-layer through an anti-ferromagnetic coupling layer. A key feature is that each of the two major sub-layers has at least two ferromagnetic sub-layers or minor sub-layers that are parallel coupled by inserting a non-magnetic layer therebetween. The non-magnetic layer also referred to as a parallel coupling layer may be comprised of a ferromagnetic coupling material, an oxide, or a dusting. The net magnetic moment of the SAF free layer is essentially zero.

The minor sub-layers are comprised of at least one of the elements Ni, Fe, or Co. The parallel coupling layer between adjacent minor sub-layers in each major sub-layer is made of at least one of Ta, Cu, Cr, Ru, Os, Re, Rh, Nb, Mo, W, Ir, and V and has a thickness that is selected to introduce parallel coupling between adjacent minor sub-layers. Similarly, the anti-ferromagnetic coupling layer preferably comprises at least one of Ru, Rh, Os, Re, Nb, Mo, W, Ir, and V and has a thickness that introduces strong anti-parallel coupling between the two major sub-layers.

The present invention is also a method of forming the nearly balanced SAF free layer comprising two major sub-layers with minor sub-layers, and an anti-parallel coupling layer described above. All layers in the SAF free layer structure are preferably deposited in an Anelva sputter deposition system or the like that has sputter deposition chambers and at least one oxidation chamber. The bottom stack of layers of the toggle MTJ cell including an AFM layer, pinned layer, and tunnel barrier layer are formed by a conventional method in the sputter deposition system. In one embodiment, the first major sub-layer is disposed on the tunnel barrier layer by sequentially forming a first minor sub-layer, a first parallel coupling layer, and a second minor sub-layer thereon. Next, an anti-parallel coupling layer is deposited to an appropriate thickness on the second minor sub-layer. Then the second major sub-layer is formed by sequentially depositing a third minor sub-layer, a second parallel coupling layer, and a fourth minor sub-layer on the anti-parallel coupling layer. The MTJ stack of layers is patterned into a MTJ cell by a well known sequence that involves patterning a photoresist on the MTJ stack, and etching through the MTJ stack in unprotected regions using an ion beam etch (IBE) or the like. The photoresist etch mask is then removed to afford an array of MTJ cells having an aspect ratio (length/width) of from 1 to 5 from a top view. An aspect ratio of 1 appears as a circle while an aspect ratio between 1 and 5 may be an ellipse or eye shape.

In a second embodiment, the two major sub-layers may be comprised of three or more minor sub-layers. Within each major sub-layer, there is a parallel coupling layer between adjacent minor sub-layers. For the first major sub-layer, a first minor sub-layer is deposited on the tunnel barrier layer. Thereafter, the sequence of forming a parallel coupling layer and a minor sub-layer thereon is repeated a plurality of times until the desired number of minor sub-layers is reached. An anti-parallel coupling layer is deposited on the upper minor sub-layer in the first major sub-layer followed by forming the second major sub-layer on the anti-parallel coupling layer. The second major sub-layer has the same number of minor sub-layers and parallel coupling layers as in the first major sub-layer and is fabricated by the same process in which a parallel coupling layer is formed between adjacent minor sub-layers.

BRIEF DESCRIPTION OF THE DRAWINGS

FIG. 1 is an oblique view showing a conventional MRAM structure in which an MTJ is formed between a first conductive line and a second conductive line.

FIG. 2 is a time sequence diagram that illustrates how the magnetic vectors for two sub-layers of a SAF free layer in a conventional toggle MRAM are switched by sequentially applying magnetic fields in the "+x" direction followed by the "x+y" direction, "y" direction, and finally setting the applied field back to zero.

DETAILED DESCRIPTION OF THE INVENTION

Figure 3:
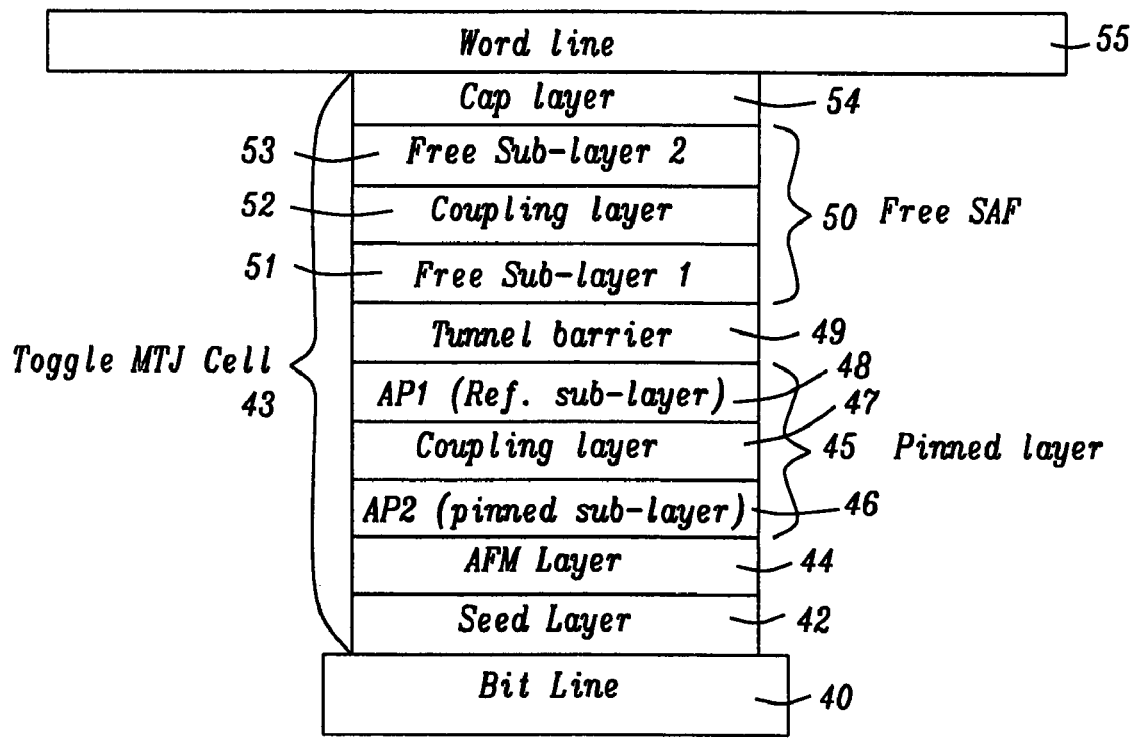
FIG. 3 is a cross-section of a toggle MTJ cell in which the free SAF layer has two major sub-layers according to one embodiment of the present invention.

The present invention is an MRAM structure with a toggle MTJ cell design wherein a SAF free layer has a nearly balanced anti-ferromagnetic (SAF) structure comprised of a first major sub-layer and a second major sub-layer with an anti-ferromagnetic layer therebetween. Within a major sub-layer, there is a plurality of minor magnetic sub-layers with a non-magnetic, parallel coupling layer between adjacent minor sub-layers. The drawings are provided by way of example and are not intended to limit the scope of the invention. Although certain drawings depict a bit line formed below a MTJ and a word line above the MTJ, the designation for bit line and word line may be reversed. Moreover, the terms bit line and word line may be interchanged with other terms such as column line, row line, data line, and digit line and that the MTJ may be a top MTJ, a bottom MTJ, or a dual MTJ as appreciated by those skilled in the art "Write word line" and "write bit line" are terms that identify the word line and bit line used to write a certain MTJ cell. Although only one MTJ cell is shown in some drawings, it should be understood that there are a plurality of MTJ cells in an array that has multiple rows and columns on an MRAM chip. The present invention is also a method of forming a toggle MTJ cell having a nearly balanced SAF free layer comprised of major sub-layers and minor sub-layers as described herein.

Referring to FIG. 2, the writing sequence for a conventional toggle MTJ cell is illustrated. A top-down view of an elliptically shaped MTJ cell 20 is depicted that is essentially centered at the intersection of an x-axis and y-axis that overlay on a first write line 21 and second write line 22, respectively. The first write line 21 contacts the bottom of the MTJ cell 20 while the second write line 22 contacts the top of the MTJ cell. The MTJ cell 20 has a stack of layers (not shown) comprised of a SAF free layer having a lower sub-layer or sub-layer 1 formed on a tunnel barrier layer (not shown), a middle coupling layer, and an upper sub-layer or sub-layer 2 formed on the coupling layer. Sub-layer 1 has a magnetic vector 24 oriented along an easy axis 23 that bisects the angle formed by the x and y axes and sub-layer 2 has a magnetic vector 25 oriented opposite to that of magnetic vector 24. The magnetic vectors 24, 25 have essentially the same magnitude and the two sub-layers have equal anisotropies. The easy axis of magnetization of the SAF free layer is the axis of anisotropy that can be induced by the shape of the MTJ cell or by the deposition process such as deposition in an applied magnetic field or at an angle of incidence. For an ellipse, the easy axis usually coincides with the long axis.

The orientations of the two magnetic vectors 24, 25 are shown during a write sequence having time intervals $t_0$-$t_4$. In a quiescent state during time interval $t_0$, no write line currents are applied and the magnetic vectors 24, 25 are oriented opposite each other along the easy axis 23. This condition may represent a memory state "0", for example. During interval $t_1$, a current in write line 22 (WL-1) generates a magnetic field (Hy) in the +y direction that causes both magnetic vectors 24, 25 to rotate in a clockwise manner. Note that the +y axis now bisects the angle formed by the magnetic vectors 24, 25. During interval $t_2$, currents in write line 21 and write line 22 (WL-2) generate magnetic fields Hy and Hx, respectively, that produce a net magnetic field along the easy axis 23 (anisotropy direction) between the +x and +y axes. Again, the magnetic vectors 24, 25 rotate in a clockwise manner (compared to their previous state). The angle $\theta_1$ between magnetic vector 24 and the anisotropy direction (axis 23) is equal to angle $\theta_1$ between magnetic vector 25 and axis 23 because of the anisotropy symmetry in the two sub-layers. In interval $t_3$, the Hy field returns to zero but a current in the second write line 22 continues to exert a field (Hx) aligned in the +x direction. As a result, the magnetic vectors 24, 25 rotate once more in a clockwise direction and are now past their anisotropy hard axis instability points. Note that the +x axis bisects the angle formed by the magnetic vectors 24, 25. During the final interval ($t_4$), there is no current in either of the write lines 21, 22 and the magnetic vectors 24, 25 rotate clockwise to the nearest easy axis position. Note that the magnetic vectors 24, 25 have each rotated 180° compared with their original position (memory state "0") to effectively switch the memory state for the MTJ cell 20 to a "1". Each time the sequence $t_0$-$t_4$ is followed, the memory state of the MTJ cell 20 changes from a "0" to a "1" or from a "1" to a "0" if the original memory state is a "1".

FIG. 3 shows a cross-sectional view of a toggle MTJ cell 43 according to one embodiment of the present invention. The toggle MTJ cell 43 is formed between a bit line 40 and word line 41 in an MRAM structure (not shown). It should be understood that the positions of the bit line and word line could be reversed. In one aspect, the toggle MTJ cell 43 is comprised of a seed layer 42, AFM layer 44, pinned layer 45, tunnel barrier 49, free SAF layer 50, and cap layer 54 that are sequentially formed on the bit line 40. All layers in the MTJ cell 43 are typically sputter deposited in an Anelva sputter deposition system or the like that has sputter deposition chambers and at least one oxidation chamber.

The seed layer 42 may be made of NiFeCr, NiCr, Ta, Ru, or laminated films thereof that promote uniform and densely packed growth in subsequently formed layers. Above the seed layer 42 is an anti-ferromagnetic (AFM) layer 44 which may be comprised of PtMn, NiMn, OsMn, IrMn, RuMn, RhMn, PdMn, RuRhMn, or PtPdMn and is used to pin the magnetization direction in an overlying ferromagnetic (pinned) layer 45.

The pinned layer 45 is preferably comprised of one or more of Ni, Co, and Fe or an alloy thereof and has a thickness between about 10 and 200 Angstroms. The magnetization direction of the pinned layer 45 may be set along the MTJ cell's easy axis (not shown). Optionally, the pinned layer 45 may be a synthetic anti-parallel pinned (SyAP) layer in which two ferromagnetic layers such as CoFe of slightly different thicknesses are separated by a thin Ru, Rh, or Ir coupling layer 47 that maintains strong anti-parallel magnetic coupling between the two ferromagnetic layers as appreciated by those skilled in the art. In the exemplary embodiment, the SyAP pinned layer 45 has a sandwich configuration in which the magnetization direction of a lower ferromagnetic (AP2) layer 46 also known as a pinned sub-layer may be fixed along the easy axis by the AFM layer 44. An upper ferromagnetic (AP1) layer 47 also known as a reference sub-layer has a magnetization direction anti-parallel to that of the AP2 layer 46 which results in a small net magnetic moment for the SyAP pinned layer 45 along the same axis as the AP2 magnetic moment. The SyAP configuration minimizes the stray field from the pinned layer magnetization.

A tunnel barrier layer 49 also known as an insulating layer is disposed on the pinned layer 45. The tunnel barrier layer 49 may be formed by sputter depositing an Al layer on the pinned layer and then oxidizing to form an $AlO_x$ layer with a thickness of about 5 to 15 Angstroms before the remaining MTJ layers are sputter deposited. Alternatively, the tunnel barrier layer 49 may be made of TiOx, HfOx, MgO, $AlN_x$, or a lamination of one or more of the aforementioned nitride and oxides.

In the present invention, the SAF free layer 50 has a thickness of from about 20 to 150 Angstroms and has a configuration comprised of a first major magnetic sub-layer 51 hereafter referred to as major sub-layer 51, an anti-ferromagnetic coupling layer 52, and a second major magnetic sub-layer 53 formed sequentially on the tunnel barrier layer 49. The two major sub-layers 51 53 have the same magnetic moments (one parallel and the other anti-parallel to the easy axis of the MTJ cell 43). Thus, the net magnetic moment of the SAF free layer 50 is essentially zero. A capping layer 54 made of a conductive material such as Cu, Ru, Ta, TaN, W or a composite layer is formed on the second major sub-layer 53 to complete the toggle MTJ cell 43 and typically has a thickness of about 50 to a few hundred Angstroms. A plurality of MTJ cells in an MRAM array is formed from the stack of layers 42-54 by a well known photoresist patterning and etching sequence.

Figure 4:
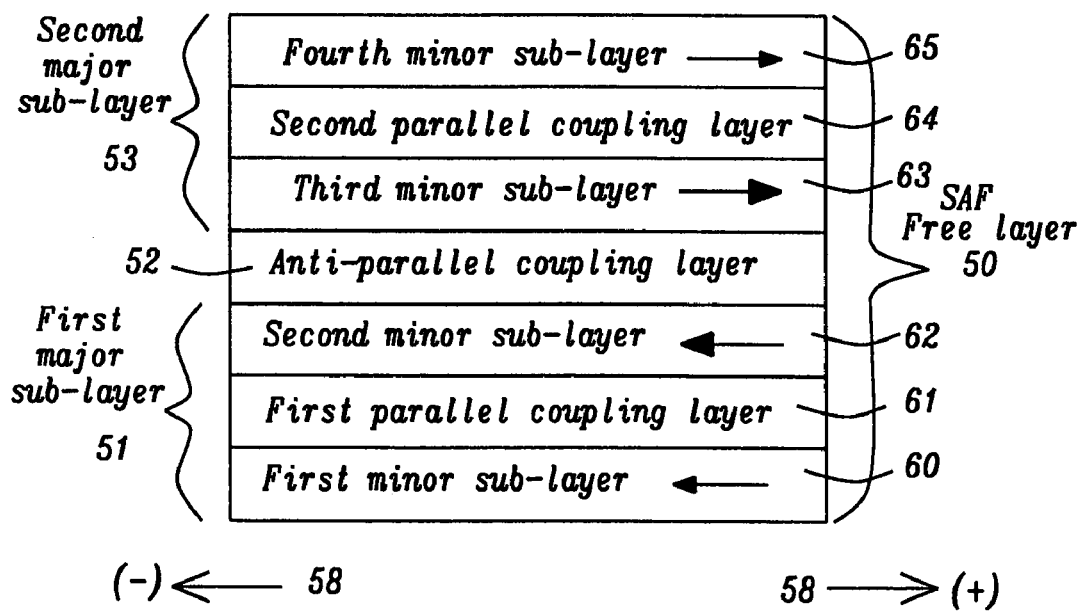
FIG. 4 is a cross-section of an enlarged portion of the SAF free layer from FIG. 3 that shows two minor sub-layers sandwiched around a parallel coupling layer (non-magnetic layer) in each of the two major sub-layers.

Referring to FIG. 4, the major sub-layers 51, 53 are each comprised of two minor sub-layers according to one embodiment of the present invention. In one aspect, the first major sub-layer 51 is comprised of a first minor sub-layer 60, a first parallel coupling layer 61, and a second minor sub-layer 62 that are sequentially formed on the tunnel barrier layer 49 and the second major sub-layer 53 is comprised of a third minor sub-layer 63, a second parallel coupling layer 64, and a fourth minor sub-layer 65 that are sequentially formed on the anti-parallel coupling layer 52 that is typically made of anti-ferromagnetic exchange coupling material as appreciated by those skilled in the art. The minor sub-layers 60, 62, 63, 65 are preferably made of the same soft magnetic material that includes at least one of the elements Co, Ni, and Fe such as $Ni_{\sim 0.8}Fe_{\sim 0.2}$, CoFeB, CoNiFe, CoFe, NiFe, or multi-layers such as CoFeB/NiFe, CoNiFe/NiFe, or NiFe/Ru/NiFe and have a thickness between about 5 and 30 Angstroms with a uni-axial anisotropy along the easy axis of about 5 to 100 Oersted (Oe).

The parallel coupling layers 61, 64 are made of a non-magnetic material and are preferably comprised of at least one of Ta, Cu, Cr, Ru, Os, Re, Rh, Nb, Mo, W, Ir, and W and have a thickness that is adjusted to provide parallel coupling between the adjacent minor sub-layers. In one aspect, the parallel coupling layers 61, 64 otherwise known as insertion layers may be formed by first depositing one or more metals on a minor sub-layer in a sputter deposition chamber and then oxidizing the metal layer in an oxidation chamber to form an oxide thereof with a thickness of about 2 to 3 Angstroms. For example, Headway patent application HT03-009 which is included herein by reference in its entirety describes the use of FeTaO or CoFeO as insertion layers in a SyAP pinned layer to increase specular reflection therein. Optionally, the parallel coupling layers 61, 64 may be formed by a dusting of one or more metals or alloys such as NiCr, Ta, Cu, or NiFeCr having a thickness between 1 and 3 Angstroms. A dusting is defined as one or two monolayers that are formed by a deposition process.

Note that when minor sub-layers 60, 62 have a magnetic moment along the negative easy axis direction, the minor sub-layers 63, 65 have a magnetic moment in the positive easy axis direction. As a result, the net magnetic moment of the SAF free layer 50 is essentially zero since the magnetic moment of the first sub-layer 51 is nearly equal and opposite that of the second sub-layer 53. However, due to slight variations in deposition conditions, or in the annealing process to set the magnetic direction of magnetic layers, or in the patterning process that shapes the MTJ cells, there may be a net magnetic moment greater than zero. The inventors have found that the net magnetic moment difference between the two major sub-layers in the SAF free layer 50 should not be more than 15% in order to realize the full benefit of the nearly balanced SAF structure according to the present invention. The bolder arrows shown for second minor sub-layer 62 and third minor sub-layer 63 indicate strong anti-parallel coupling provided by the anti-ferromagnetic coupling layer 52 that is typically made of Ru, Rh, Ir, Re, Os, Nb, Mo, W or V and has a thickness of about 5 to 40 Angstroms and preferably 8 Angstroms when comprised of Ru.

Figure 5:
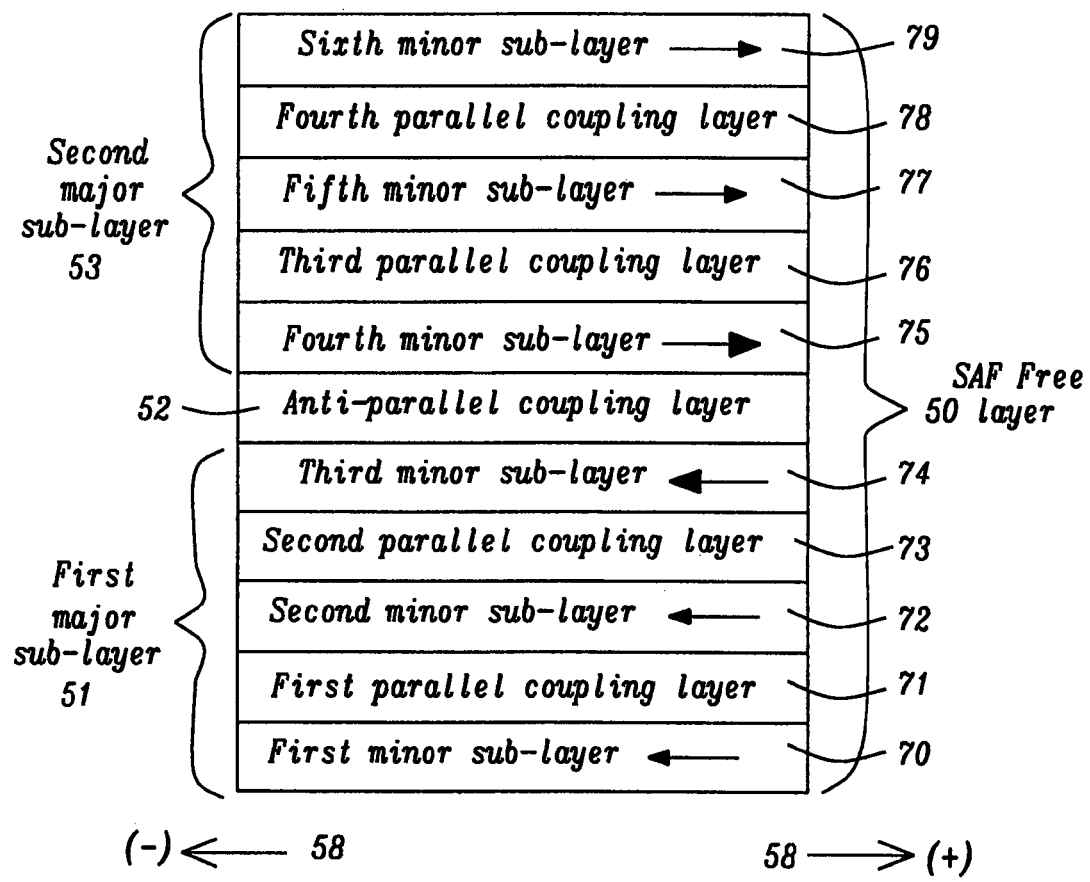
FIG. 5 is a cross-section of an enlarged portion of the SAF free layer from FIG. 3 that shows each major sub-layer having three minor sub-layers and two parallel coupling layers according to a second embodiment of the present invention.

Referring to FIG. 5, the major sub-layers 51, 53 are each comprised of three minor sub-layers according to a second embodiment of the present invention. In one aspect, the first major sub-layer 51 is comprised of a first minor sub-layer 70, a first parallel coupling layer 71, a second minor sub-layer 72, a second parallel coupling layer 73, and a third minor sub-layer 74 that are sequentially formed on the tunnel barrier layer (not shown). The second major sub-layer 53 is comprised of a fourth minor sub-layer 75, a third parallel coupling layer 76, a fifth minor sub-layer 77, a fourth parallel coupling layer 78, and a sixth minor sub-layer 79 that are sequentially formed on the anti-parallel (anti-ferromagnetic) coupling layer 52. The minor sub-layers 70, 72, 74, 75, 77, 79 are preferably made of the same soft magnetic material and have a similar thickness to the minor sub-layers described previously in the first embodiment. In the exemplary embodiment, minor sub-layers 70, 72, 74 in the first major sub-layer 51 have a magnetic moment aligned in the negative direction of the easy axis 58 while minor sub-layers 75, 77, 79 in the second major sub-layer 53 have a magnetic moment aligned in the positive direction of the easy axis. Note that the third minor sub-layer 74 is strongly anti-parallel coupled to the fourth minor sub-layer 75 through the anti-parallel coupling layer 52.

The parallel coupling layers 71, 73, 76, 78 may be considered insertion layers and are comprised of the same non-magnetic material as described previously with regard to parallel coupling layers 61, 64.

The present invention also encompasses an embodiment wherein each of the two major sub-layers in the SAF free layer is comprised of a plurality of "n" minor sub-layers and "n–1" parallel coupling layers where n is an integer>1. Within each major sub-layer, there is a parallel coupling layer between adjacent minor sub-layers. For the first major sub-layer, a first minor sub-layer is deposited on the tunnel barrier layer. Thereafter, the sequence of forming a parallel coupling layer and a minor sub-layer thereon is repeated "n–1" times. An anti-parallel coupling layer is deposited on the upper minor sub-layer in the first major sub-layer followed by forming the second major sub-layer on the anti-parallel coupling layer. The second major sub-layer also has "n" minor sub-layers and "n–1" parallel coupling layers arranged in the same configuration as the first major sub-layer.

Figure 6:
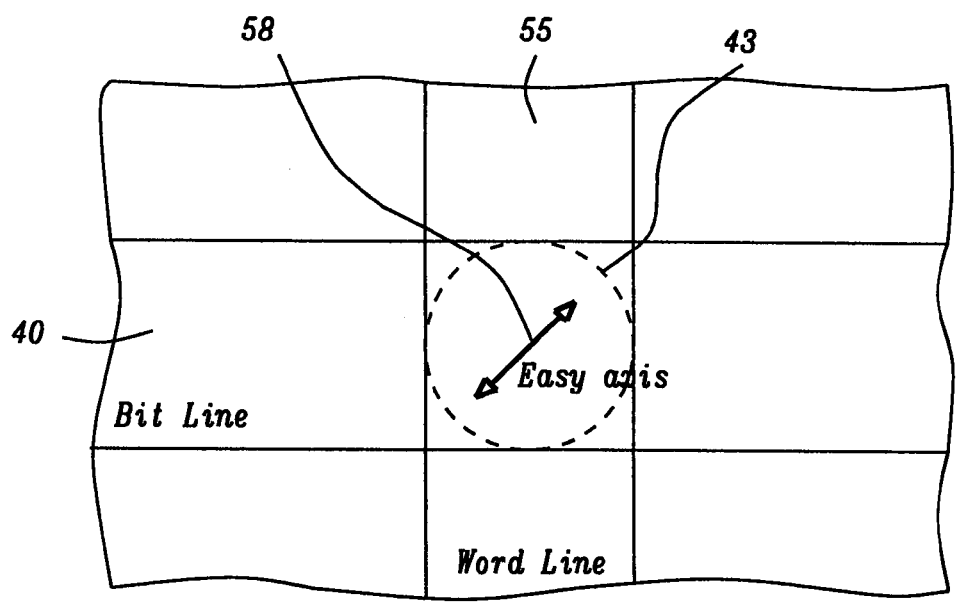
FIG. 6 is a top view of a toggle MRAM wherein the easy axis of the MTJ cell is aligned at a 45° angle to the bit line and at a 45° angle to the word line.

FIG. 6 is a top view of a toggle MTJ cell 43 according to the present invention that is formed in an intersection region between a bit line 40 and a word line 55 also referred to as the write bit line and write word line, respectively. The easy axis 58 is aligned at an angle of about 45° away from the write bit line and write word line. The easy axis 58 of magnetization of the SAF free layer 50 is the axis of anisotropy that can be induced by the shape of the cell or by the deposition process such as deposition in an applied magnetic field. If the anisotropy is induced during deposition, then the cells may have the same shape and matching parameters such as a circular shape depicted in FIG. 6. Alternatively, the toggle MTJ cell 43 and SAF free layer 50 may be patterned into an ellipse-like shape by a well known photoresist patterning and ion beam etch (IBE) or reactive ion etch (RIE) sequence. In this case, the easy axis is typically the long axis of the ellipse and the hard axis is the short axis. From a top view, the ellipse-like structure may have an aspect ratio (long axis/short axis) of from 1 to about 5.

The operation of toggle write processes in the present invention is the same as that of conventional toggle cells. However, as shown in FIGS. 7-10, the rotation of the two outer minor sub-layers 60, 65 according to the first embodiment, is greater than that of the two inner sub-layers 62, 63 since there is a finite ferromagnetic coupling between the minor sub-layers in each sub-layer 51, 53. Here, an inner sub-layer is defined as a minor sub-layer that is adjacent to the anti-parallel coupling layer 52 while an outer sub-layer is a minor sub-layer that is adjacent to the tunnel barrier 49 or capping layer 54.

Figure 7:
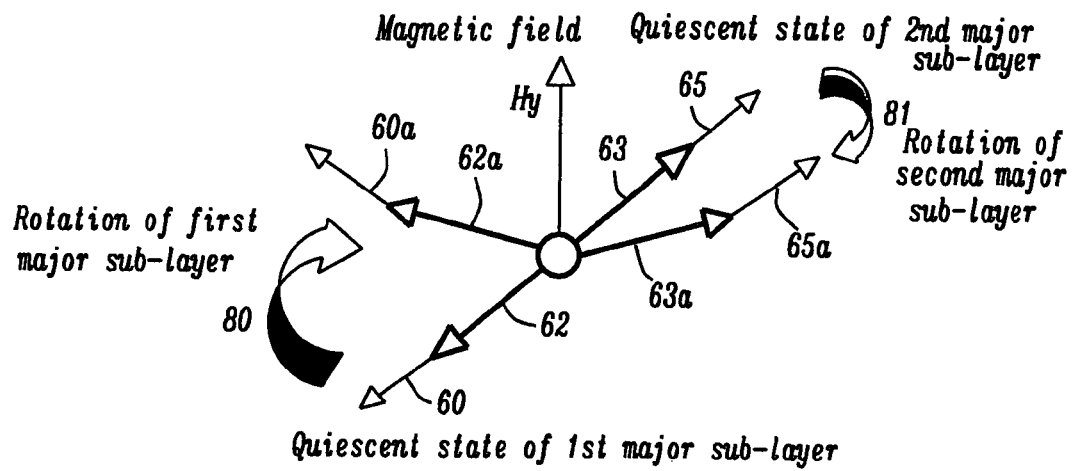
FIG. 7 is a diagram showing the rotation of major sub-layers and magnetic vectors for minor sub-layers of the SAF free layer in a toggle MTJ cell when a field Hy is applied according to the present invention.

Referring to FIG. 7, magnetic vectors for the minor sub-layers in a SAF free layer 50 rotate in response to an applied magnetic field that can be generated with current in bit line 40 and word line 55. The magnetic vector for the first minor sub-layer 60 and for the second minor sub-layer 62 in the toggle MTJ cell 43 may be aligned along the easy axis 58 (negative direction) while the magnetic vectors for the third minor sub-layer 63 and fourth minor sub-layer 65 may be oriented in the opposite direction along the easy axis 58 during a quiescent state that represents a memory state "1". On the other hand, the vectors for the four minor sub-layers may be in the opposite direction from their positions in memory state "1" and this quiescent state represents a memory state "0". When a magnetic field $H_Y$ is applied at an angle of about 45° away from the anisotropy direction (easy axis 58) using a current in bit line 40, the magnetizations of the four minor sub-layers rotate to form a scissoring structure facing the applied field $H_Y$. Note, however, that the magnetic vectors 60a and 65a for the outer two minor-sub layers 60, 65 are aligned slightly more toward the $H_Y$ magnetic field direction than the vectors 62a, 63a for the inner two minor sub-layers 62, 63 because there is a finite ferromagnetic coupling between the two minor sub-layers in each major sub-layer 51, 53. The rotation 80 of the first major sub-layer 51 is in a clockwise manner and the rotation 81 for the second major sub-layer 53 is also in a clockwise manner from a quiescent state previously referred to as the "1" memory state. There is no change in memory state of the toggle MTJ cell 43 during this first step of the writing process.

Figure 8:
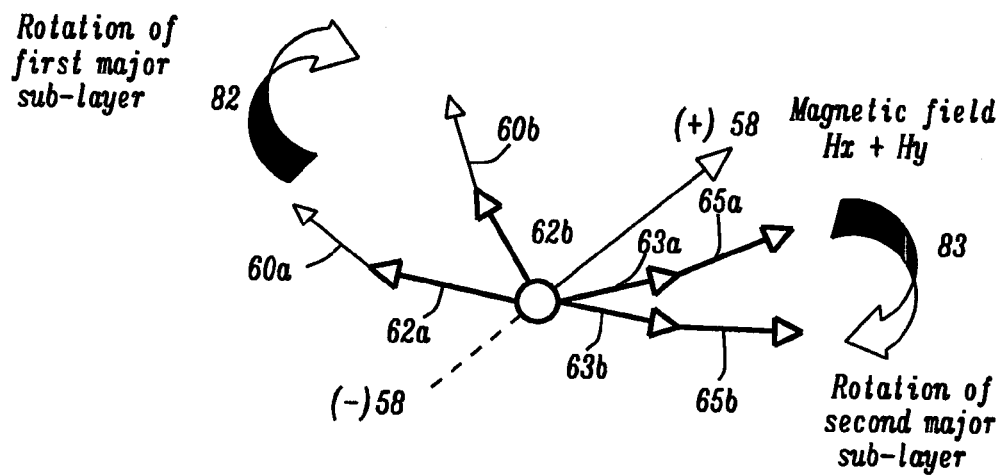
FIG. 8 is a diagram showing the rotation of major sub-layers and magnetic vectors for minor sub-layers relative to their positions in FIG. 7 when a field Hx+Hy is applied according to the present invention.

Referring to FIG. 8 and step 2, a current is applied in both bit line 40 and word line 55 to generate a magnetic field $H_X+H_Y$ along the positive direction of the easy axis 58. The first major sub-layer 51 rotates clockwise 82 and the minor sub-layer 60, 62 rotate to positions represented by vectors 60b, 62b, respectively. Meanwhile, the second major sub-layer 53 rotates clockwise 83 and the minor sub-layers 63, 65 rotate to positions represented by vectors 63b, 65b, respectively.

Figure 9:
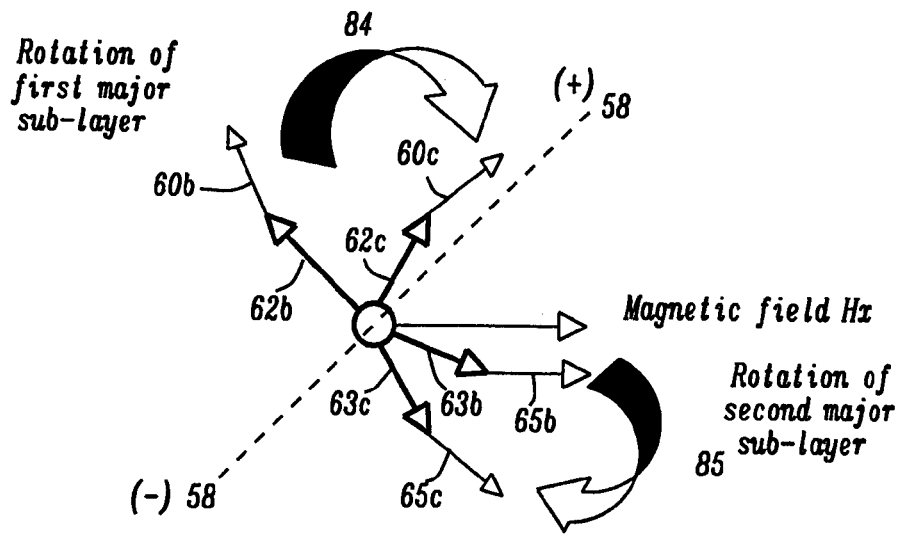
FIG. 9 is a diagram showing the rotation of major sub-layers and magnetic vectors for minor sub-layers relative to their positions in FIG. 8 when a field Hx is applied according to the present invention.
Figure 10:
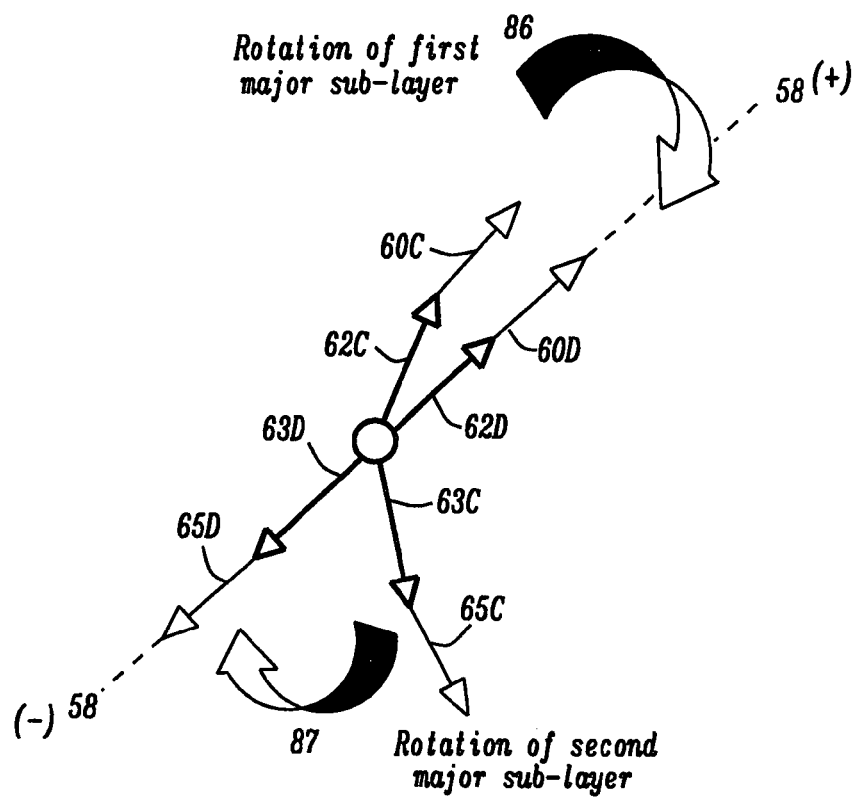
FIG. 10 is a diagram showing the rotation of major sub-layers and magnetic vectors for minor sub-layers relative to their positions in FIG. 9 when the field is reduced to zero according to the present invention.

Referring to FIG. 9 and step 3, a current is applied in word line 55 to generate a magnetic field $H_X$ at a 45° angle away from the positive direction of the easy axis 58. The first major sub-layer 51 rotates clockwise 84 and the minor sub-layers 60, 62 rotate to positions represented by vectors 60c, 62c, respectively. Meanwhile, the second major sub-layer 53 rotates clockwise 85 and the minor sub-layers 63, 65 rotate to positions represented by vectors 63c, 65c, respectively. The magnetic vectors 60c, 62c, 63c, 65c are now beyond their hard axis instability points In the final step depicted in FIG. 10, the applied field is reduced to zero and the magnetic vectors for the two minor sub-layers in the first major sub-layer align themselves along the nearest easy axis direction that corresponds to vectors 60d, 62d. Thus, the first major sub-layer undergoes a clockwise rotation 86. Since the second major sub-layer 53 is anti-parallel coupled to the first major sub-layer 51, the magnetic vectors 63c, 65c for the third and fourth minor sub-layers align themselves opposite those of the minor sub-layers in the first major sub-layer. The second major sub-layer rotates clockwise 87 and is now aligned along the negative easy axis 58 direction. The net result of the write process illustrated in FIGS. 7-10, is that a new memory state "0" has been written to the toggle MTJ cell 43. Alternatively, a "1" memory state may be written to the toggle MTJ cell if the original memory state is a "0".

Figure 11:
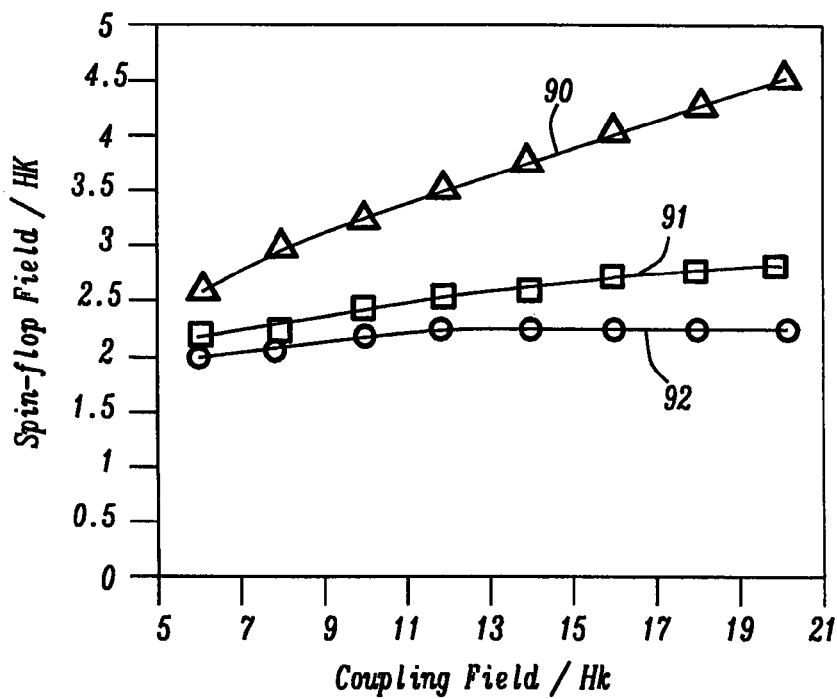
FIG. 11 shows a simulation result for a flip-flop field (normalized by Hk) as a function of ferromagnetic coupling strength (normalized by Hk) for both major sub-layers in a toggle MTJ cell according to the present invention.

Referring to FIG. 11, a simulation result is shown for a spin-flop field (normalized by Hk) as a function of ferromagnetic coupling strength (normalized by Hk) for both the first major sub-layer and second major sub-layer in a SAF free layer. The anti-ferromagnetic coupling strength across a Ru anti-ferromagnetic coupling layer between the two major sub-layers is 20 times Hk. Curve 91 represents the result for a toggle MTJ cell 43 according to the first embodiment of the present invention in which each of the two major sub-layers is comprised of two minor sub-layers that are separated by a non-magnetic layer which induces parallel coupling between adjacent minor sub-layers. Curve 92 represents the result for a toggle MTJ cell 43 according to the second embodiment of the present invention wherein each of the two major sub-layers has three minor sub-layers and two non-magnetic or parallel coupling layers. For comparison, curve 90 shows the calculated result from a conventional toggle cell that has two major sub-layers each comprised of two minor sub-layers that are separated by an anti-ferromagnetic layer such as Ru. The inventors have found that using ferromagnetic coupling between minor sub-layers in each major sub-layer provides a smaller and much more uniform spin-flop field as indicated by curves 91, 92. As a result, a smaller write current in needed for the toggle MTJ cell of the present invention and power consumption will be decreased.

One advantage of the present invention is that the toggle MTJ cell described herein does not have half-selected issues as in traditional MRAMs and therefore the written memory states are more stable. A primary advantage over a conventional toggle cell design is that the selected MTJ cells can be written with a smaller write current and therefore lower power consumption that will make toggle MRAM more competitive with DRAM, SRAM, and FLASH memory. This result can be achieved by using the same processing equipment and by replacing the conventional anti-ferromagnetic coupling layer with a ferromagnetic coupling layer between the minor sub-layers within a major sub-layer in a SAF free layer. The method of forming the ferromagnetic coupling layers also known as non-magnetic coupling layers is versatile in that a wide variety of metals or oxides thereof may be used and the thickness of the non-magnetic layer may be adjusted to optimize the parallel coupling between adjacent layers. The same sputter deposition system used to form a conventional toggle MTJ cell may be employed for the toggle MTJ cell design of the present invention.

While this invention has been particularly shown and described with reference to, the preferred embodiment thereof, it will be understood by those skilled in the art that various changes in form and details may be made without departing from the spirit and scope of this invention.

I claim:

1. A magnetic random access memory (MRAM) structure having a toggle MTJ cell wherein a synthetic anti-ferromagnetic (SAF) free layer is formed adjacent to a tunnel barrier layer and is comprised of a stack that has a first major sub-layer disposed on the tunnel barrier layer, an anti-parallel coupling layer on the first major sub-layer, and a second major sub-layer on the anti-parallel coupling layer, said major sub-layers are each comprised of:
   (a) a plurality of "n" minor sub-layers that are ferromagnetic in which one minor sub-layer is adjacent to the anti-parallel coupling layer and wherein n is an integer >1; and
   (b) "n−1" parallel coupling layers arranged such that there is a parallel coupling layer between adjacent minor sub-layers.

2. The MRAM structure of claim 1 wherein the "n−1" parallel coupling layers within each major sub-layer are comprised of a non-magnetic material that is one or more of the elements Ta, Cu, Cr, Ru, Os, Re, Rh, Nb, Mo, Ir, W, and V, a metal oxide, or a dusting made of NiCr, Cu, Ta, or NiFeCr.

3. The MRAM structure of claim 2 wherein the "n−1" parallel coupling layers within each major sub-layer have a thickness between about 1 and 3 Angstroms.

4. The MRAM structure of claim 1 wherein the anti-parallel coupling layer is made of an anti-ferromagnetic coupling material which is comprised of one or more of Ru, Rh, Os, Re, Nb, Mo, W, Ir, and V.

5. The MRAM structure of claim 4 wherein the anti-parallel coupling layer has a thickness between about 5 and 40 Angstroms.

6. The MRAM structure of claim 1 wherein the minor sub-layers are comprised of at least one of Ni, Fe, and Co, and each has a thickness of about 5 to 30 Angstroms.

7. The MRAM structure of claim 1 wherein the SAF free layer has a net magnetic moment that is essentially zero.

8. The MRAM structure of claim 1 wherein the two major sub-layers have a net magnetic moment difference of less than about 15%.

9. The MRAM structure of claim 1 wherein each of the minor sub-layers within the first major sub-layer has a magnetic moment in a first direction along an easy axis, and each of the minor sub-layers within the second major sub-layer has a magnetic moment in an opposite direction to the first direction.

* * * * *